United States Patent [19]

Haisma et al.

[11] Patent Number: 5,284,803
[45] Date of Patent: Feb. 8, 1994

[54] METOD OF MANUFACTURING A SEMICONDUCTOR BODY USING A CARRIER WAFER AND A MONOCRYSTALLINE SEMICONDUCTING TOP LAYER

[75] Inventors: Jan Haisma; Franciscus J. H. M. Van Der Kruis, both of Eindhoven, Netherlands

[73] Assignee: U.S. Philips Corporation, Tarrytown, N.Y.

[21] Appl. No.: 991,691

[22] Filed: Dec. 16, 1992

[51] Int. Cl.$^5$ .......................................... H01L 21/302
[52] U.S. Cl. .................... 437/225; 437/914; 437/966; 437/974; 148/DIG. 12; 156/630
[58] Field of Search .............. 437/225, 914, 966, 974; 148/DIG. 135, DIG. 12; 156/630, 637, 639

[56] References Cited

U.S. PATENT DOCUMENTS 4,880,684 11/1989 Boss et al. .

FOREIGN PATENT DOCUMENTS 0337556 10/1989 European Pat. Off. .

OTHER PUBLICATIONS

Haisma, J. et al, "Silicon On Insulator . . . Evaluations", Japanese J. Appl. Phys. vol. 28, No. 8 (1989) pp. 1426–1443.

*Primary Examiner*—George Fourson
*Attorney, Agent, or Firm*—Steven R. Biren

[57] ABSTRACT

A method of manufacturing a semiconductor body (1), whereby a carrier wafer (2) with an optically smooth main surface (3) is provided with a semiconducting top layer (4) in that the main surface (3) is brought into contact with an optically smooth main surface (5) of a monocrystalline semiconductor wafer (6), a permanent bond being formed, after which the semiconductor wafer (6) is made thin by means of a grinding process and a polishing process in that order. The semiconductor wafer (6) is made thin in the polishing process in that the exposed main surface (9) of the carrier wafer (2) is made wear-resistant, and in that then the carrier wafer (2) bonded to the semiconductor wafer (6) is arranged between two plane polishing discs (10) and (11) provided with a polishing liquid, upon which these polishing discs (10, 11) and the exposed main surfaces (8, 9) are moved relative to one another. It is achieved by this that a semiconductor body (1) with a carrier wafer (2) and a top layer (4) can be manufactured in a simple manner suitable for mass production. It is also found that a top layer (4) with smaller layer thickness variations can be manufactured.

9 Claims, 2 Drawing Sheets

METOD OF MANUFACTURING A SEMICONDUCTOR BODY USING A CARRIER WAFER AND A MONOCRYSTALLINE SEMICONDUCTING TOP LAYER

BACKGROUND OF THE INVENTION

The invention relates to a method of manufacturing a semiconductor body whereby a carrier wafer having an optically smooth main surface is provided with a semiconducting top layer in that the main surface is brought into contact with an optically smooth main surface of a monocrystalline semiconductor wafer so that a permanent bond is formed, after which the semiconductor wafer is made thin by means of a grinding process followed by a polishing process.

Such a method may be used, for example, for manufacturing a semiconductor body having a carrier wafer and a top layer of different doping types or with different concentrations of doping atoms. A semiconductor body having an insulating or electrically conducting intermediate layer between the top layer and the carrier wafer can also be made by the method in that the carrier wafer or the semiconducting wafer is provided with the insulating or well conducting layer before the bond is made. Semiconductor elements may be provided in the top layer. The carrier wafer is connected to the semiconductor wafer by means of wringing whereby the optically smooth main surfaces of the wafers are brought into contact with one another, after which a reinforced permanent connection is made by means of a heat treatment ("wafer bonding"). After that, the semiconductor slice is first made thin in the grinding process, by which much material is taken off quickly, from a thickness of approximately 500 μm down to a thickness of approximately 50 μm, after which the eventual layer thickness of approximately 5 μm is achieved slowly, but with great precision, in the polishing process.

European Patent Application 337556 discloses a method of the kind mentioned in the opening paragraph whereby the carrier wafer is fastened to a support body by means of a wax (cement) after wafer bonding, upon which the semiconductor wafer is ground and polished under the supply of a grinding or polishing liquid.

During the polishing process, when the thickness of the top layer is reduced from approximately 50 μm to approximately 5 μm, a support body with a very high geometric precision is required. Fastening of the wafers on the support body must also take place with very high accuracy. The known method described has the disadvantage that the use of a support body on which the two bonded wafers are to be fastened is inconvenient during polishing of the wafer in mass manufacture.

SUMMARY OF THE INVENTION

The invention has for its object inter alia to provide a method which is more suitable for mass manufacture in the polishing process, while a layer having lesser thickness variations is manufactured.

According to the invention, the method is for this purpose characterized in that the semiconductor wafer is made thin in the polishing process in that the exposed main surface of the carrier wafer is rendered wear-resistant and in that then the carrier wafer bonded to the semiconductor wafer is arranged between two flat polishing discs provided with a polishing liquid, upon which these polishing discs and the exposed main surfaces are moved relative to one another.

It is achieved by this that a semiconductor body with a carrier wafer and a top layer can be manufactured in a simple manner suitable for mass production. In addition, it is found that a top layer with less variation in layer thickness can be manufactured.

The invention is based on the recognition that, both in the known method and in the method according to the invention, the thickness of the semiconductor body is rendered equal everywhere during bulk reduction in that the exposed main surface of the semiconductor slice is processed in such a manner that this main surface is rendered parallel to a reference surface. In the method according to the invention, the wear-resistant main surface of the carrier wafer acts as a reference surface. In the known method, a smooth and plane main surface of the support body on which the exposed main surface of the carrier wafer is fastened is used as the reference surface. Inaccuracies in the bulk reduction process then take place in practice because the support body is not perfectly smooth and plane and because the wax used for fastening the carrier wafer on the support body is not equally thick everywhere between the wafer and the support body.

Several measures are possible for rendering the exposed main surface of the carrier wafer wear-resistant. Thus it is possible to take measures for maintaining a lubricant film between the carrier wafer and the polishing disc. Preferably, however, the main surface of the carrier wafer is rendered wear-resistant in that a wear-resistant material is taken as the material for the carrier wafer.

Many wear-resistant materials are known, for example metals, which can be used as materials for the carrier wafer. Preferably, a ceramic material is taken as the material. Owing to their great hardness and chemical inertness, ceramic materials have a high wear resistance, while ceramic carrier wafers can be manufactured to a high accuracy. Preferably, a material from the group comprising nitrides or carbides is taken as the ceramic material, for example, aluminium nitride, boron carbide, or cubic boron nitride. These ceramic materials in particular are highly suitable because of their ready availability and good processing qualities.

If the material of the carrier wafer cannot be freely chosen because of, for example, electrical properties, the exposed main surface of the carrier wafer is preferably rendered wear-resistant in that this main surface is provided with a wear-resistant layer. Such a layer may be manufactured from, for example, a hard metal. Preferably, however, a nitride, carbide, or diamond layer is taken for the wear-resistant layer. Such a layer has a great hardness and can be vapor-deposited in a simple manner through, for example, a decomposition process from the gas phase (Chemical Vapor Deposition, CVD) with great accuracy as to thickness.

A particular advantage is obtained when both the carrier wafer and the semiconductor wafer are silicon wafers. Such wafers are available with small variations in wafer thickness, so that carrier wafers with the desired thickness tolerances can be procured or manufactured with comparatively little trouble. The exposed main surface of the carrier wafer is then rendered wear-resistant in that this main surface is provided with a ceramic layer, preferably an aluminium nitride layer. This layer not only has a high wear resistance, but also a coefficient of expansion which is practically the same as that of silicon.

A wear-resistant layer provided on the carrier wafer usually has internal mechanical stresses. The semiconductor body will become warped by this. Preferably, therefore, grooves extending down to the carrier wafer are provided in the wear-resistant layer. Such grooves prevent warping of the semiconductor body.

Preferably, the polishing process utilizes such polishing discs that the polishing disc facing the exposed main surface of the carrier wafer has a lesser polishing action than the polishing disc facing the exposed main surface of the semiconductor wafer. This may be achieved in a simple manner in that, for example, polishing discs with different yields or absorption rates of polishing liquid are taken, or in that the polishing disc facing the exposed main surface of the carrier wafer is provided with a permanent lubricant such as teflon.

The invention will be explained in more detail below, by way of example, with reference to an embodiment and drawing, in which:

BRIEF DESCRIPTION OF THE DRAWINGS

The Figures are purely diagrammatic and not drawn to scale. Corresponding parts are generally given the same reference numerals in the Figures.

DESCRIPTION OF THE PREFERRED EMBODIMENTS

Figure 1A:
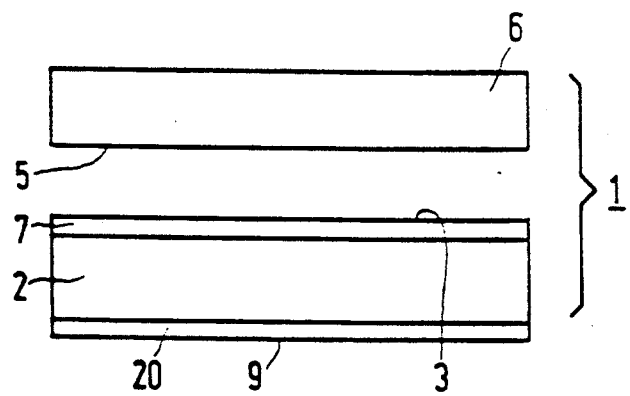
FIG. 1a is an elevation of the carrier wafer and the semiconductor wafer before the semiconductor wafer is fastened on the carrier wafer.
Figure 1B:
FIG. 1b is an elevation of the semiconductor body comprising the carrier wafer and the thinned semiconductor wafer which acts as a top layer.

FIG. 1 shows a semiconductor body 1(a and b) manufactured in that a carrier wafer 2 with an optically smooth main surface 3 is provided with a semiconducting top layer 4 in the following way: the main surface 3 is brought into contact with an optically smooth main surface 5 of a monocrystalline semiconductor wafer 6, whereby a permanent bond is formed, after which the semiconductor wafer 6 is reduced in thickness in a grinding and polishing process.

Such a method may be applied, for example, for manufacturing a semiconductor body 1 with a carrier wafer 2 and a top layer 4 of different doping types or different concentrations of doping atoms. Alternatively, a semiconductor body 1 with an insulating or well conducting intermediate layer 7 between the top layer 4 and the carrier wafer 2 can be made by the method in that the carrier wafer 2 or the semiconducting wafer 6 is provided with the insulating or well conducting layer 7 before bonding, for example, in that the carrier wafer 2 is oxidized or a metal layer is vapor-deposited. Semiconductor elements such as transistors, diodes, and ICs (not shown) may be provided in the top layer 4. The version having a monocrystalline silicon top layer 4 on an insulating intermediate layer 7 or insulating carrier wafer 2, also called SOI (Silicon On Insulator), is eminently suitable for obtaining semiconductor devices with favourable properties. For example, semiconductor devices with an SOI structure are less sensitive to radiation than conventional semiconductor devices. The carrier wafer 2 is connected to the semiconductor wafer 6 by wringing, whereby the optically smooth main surfaces 3 and 5 of the wafers 2 and 6 are brought into contact with one another, after which a reinforced permanent connection is made (wafer bond reinforcement) by means of a heat treatment, for example, of ten minutes at 1200° C. The semiconductor wafer 6 in practice has a thickness of approximately 500 $\mu$m. This wafer 6 is reduced to a thickness of approximately 5 $\mu$m in a grinding and polishing process after wafer bonding. For this purpose, the wafer 6 is first mechanically ground down to a thickness of 50 $\mu$m, for example, in a so-called back lapping process. Such a process is applied on a large scale in semiconductor industry for the bulk reduction of semiconductor wafers from a non-active lower side of the wafer. In this process, a large number of wafers is held against a flat plate by means of vacuum, after which the wafers are reduced to a thickness of approximately 50 $\mu$m by means of a grinding disc coated with diamonds. Because of the final thickness result, no extreme requirements are imposed on the accuracy of this process. The grinding action leads to damage below the surface 8. In a subsequent operation, this damage must be eliminated and a very high geometric precision must be achieved. In practice, therefore, the semiconductor body 1 is fastened to a support body 2 with a wax to a very high geometric accuracy, and the semiconductor wafer is polished, for example, with a tribochemical polishing agent such as Syton: $SiO_2$ particles with an average particle size of 30 nm in a KOH solution with a pH value between 10 and 11. Polishing pressure may be, for example, 300–500 g/cm$^2$. The wafer 6 is then reduced to the final thickness of, for example, 5 $\mu$m.

Figure 2A:
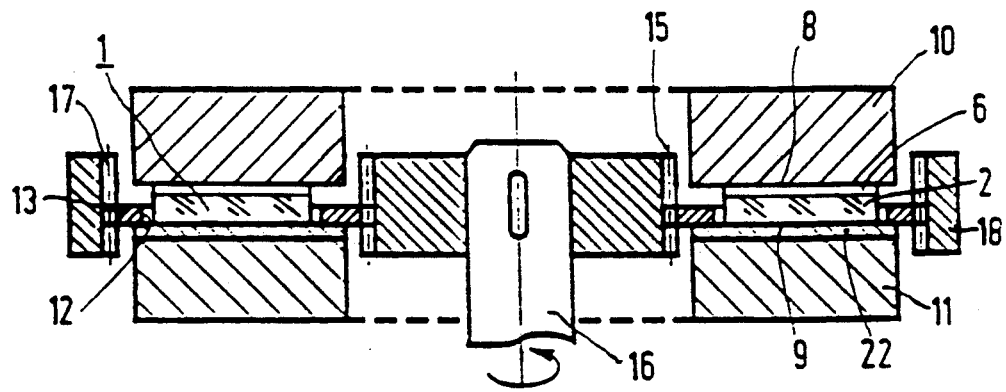
FIG. 2a is a side elevation and FIG. 2b is a plan view of a device for polishing the semiconductor body.
Figure 2B:
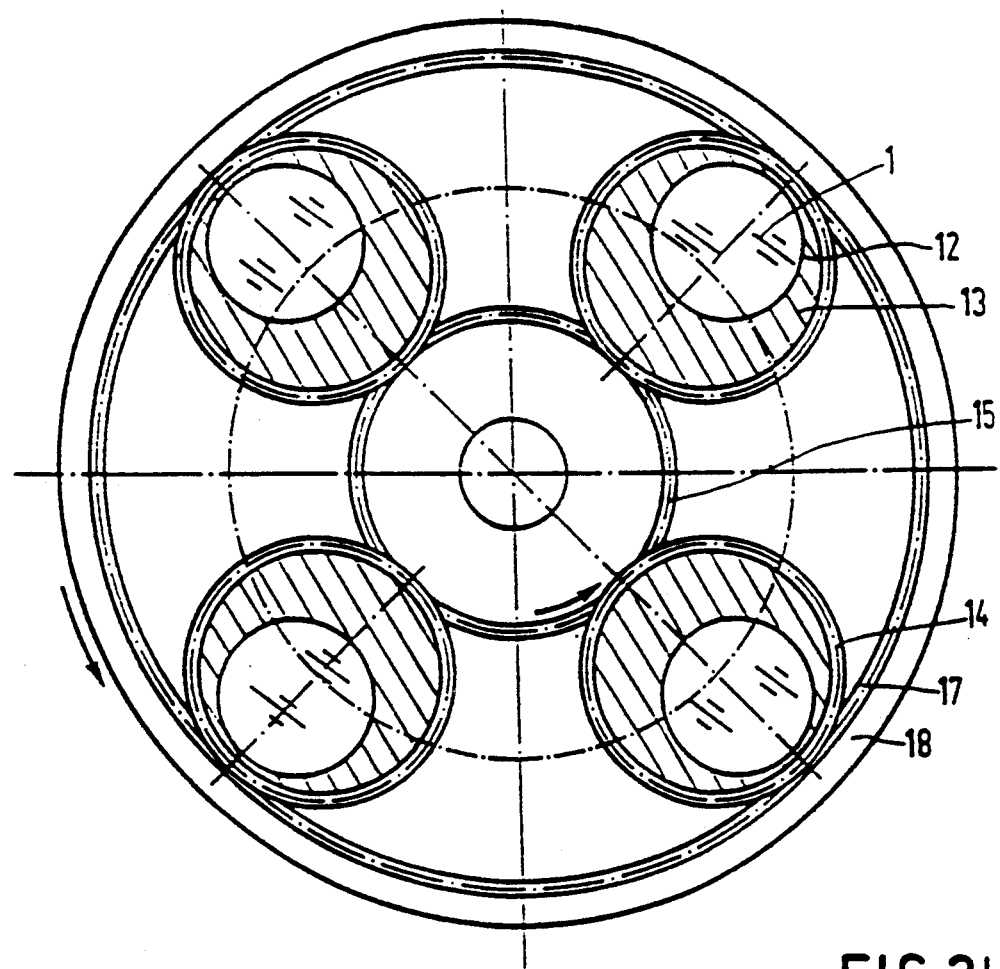

In mass manufacture, however, the use of a support body with a very high geometric precision is unfavorable: fastening of the wafers on the support body must take place very accurately, and the support body itself is expensive and difficult to manufacture. In the method according to the invention, therefore, the semiconductor wafer 6 is made thin in the polishing process in that the exposed main surface 9 of the carrier wafer 2 is rendered wear-resistant, and in that then the carrier wafer 2 and the semiconductor wafer 6 are arranged between two flat polishing discs 10 and 11 provided with a polishing liquid, after which these discs 10 and 11 and the exposed main surfaces 8 and 9 are moved relative to one another (see FIGS. 2a and 2b). By "wear-resistant" is meant in this case that the geometric precision of the main surface 9 is maintained in the polishing process. FIGS. 2a and 2b shows a side elevation and plan view of a device for the thickness reduction of the semiconductor wafer 6 by way of example. Semiconductor bodies 1, comprising carrier wafers 2 bonded to semiconductor wafers 6, are present in this device between two stationary polishing discs 10 and 11. The semiconductor bodies 1 are present in openings 12 which are situated eccentrically in round guide discs 13. The thickness of the guide discs 13 is smaller than the thickness of the semiconductor bodies 1. The guide discs 13 are driven at their outer circumferences by teeth 14. These teeth 14 engage with teeth 15 on a central shaft 16 and teeth 17 provided on an outer ring 18. When the outer ring 18 and the central shaft 16 are rotated, the semiconductor bodies 1 will move relative to the polishing discs 10 and 11. The rotational speeds of the central shaft 16 and the outer ring 18 will determine the exact movements of the semiconductor bodies.

Thus a semiconductor body comprising a carrier wafer and a top layer may be manufactured in a simple manner suitable for mass production.

During bulk reduction, the thickness of the semiconductor body is rendered the same everywhere in the method according to the invention in that the exposed main surface 8 of the semiconductor slice 6 is so processed that this main surface 8 is rendered parallel to the wear-resistant main surface 9 of the carrier wafer 2. By moving the main surfaces 8 and 9 of the semiconductor body 1 relative to the polishing discs 10 and 11, any unevenness in the surface of the polishing discs 10 and 11 is not concentrated locally, but the effect of the unevenness is averaged out over the entire main surface 8 and 9, and thus compensated.

Various measures are possible for rendering the exposed main surface 9 of the carrier wafer 2 wear-resistant. Thus measures may be taken to maintain a lubricant film between the carrier wafer 2 and the polishing disc 11, for example, by means of a hydrostatic bearing. Preferably, however, the main surface 9 of the carrier wafer 2 is rendered wear-resistant in that a wear-resistant material is taken as the material for the carrier wafer 2. Many wear-resistant materials are known, for example hard metals, which can be used as materials for the carrier wafer. Preferably, a ceramic material is taken for this purpose. Ceramic materials have a high wear resistance on account of their great hardness and chemical inertness, both as regards mechanical wear through abrasion with hard particles and as regards chemical attack by chemically acting polishing agents. In addition, ceramic carrier wafers can be manufactured to a high accuracy. Preferably, a material from the group comprising nitrides or carbides is taken as the ceramic material, for example aluminium nitride, boron carbide, or cubic boron nitride. These ceramic materials in particular are highly suitable in practice because of their ready availability and good processing qualities.

The material of the carrier wafer 2 cannot be freely chosen when, for example, a semiconductor body 1 is manufactured from a carrier wafer 2 and a top layer 4 of different doping types or different concentrations of doping atoms. In such a case the exposed main surface 9 of the carrier wafer 2 is preferably rendered wear-resistant in that this main surface 9 is provided with a wear-resistant layer 20. Such a layer may be manufactured from, for example, a hard metal such as chromium or nickel. Preferably, however, a nitride, carbide, or diamond layer is taken for the wear-resistant layer. Such a layer has a great hardness and can be deposited with great thickness accuracy in a simple manner by known techniques through, for example, a decomposition process from the gas phase (Chemical Vapor Deposition, CVD). Thus a nitride such as silicon nitride may be obtained from a chemical reaction of ammonia with silane at approximately 800° C. in known manner.

A particular advantage is obtained when a silicon wafer is taken both for the carrier wafer 2 and for the semiconductor wafer 6. Such wafers are available with small variations in wafer thickness, for example approximately 0.3 $\mu$m variation over a thickness of 500 $\mu$m, so that carrier wafers with the desired thickness tolerances can be procured or manufactured with comparatively little trouble. The exposed main surface 9 of the carrier wafer 2 is then rendered wear-resistant in that this main surface 9 is provided with a ceramic layer 20, preferably an aluminium nitride layer. This layer not only has a high wear resistance but also a coefficient of expansion (approximately 4.0 $10^{-6°}$ C.$^{-1}$) which is practically equal to that of silicon (approximately 3.0 $10^{-6°}$ C.$^{-1}$). The aluminium nitride layer may be provided in usual manner at room temperature through reactive magnetron sputtering.

Figure 3A:
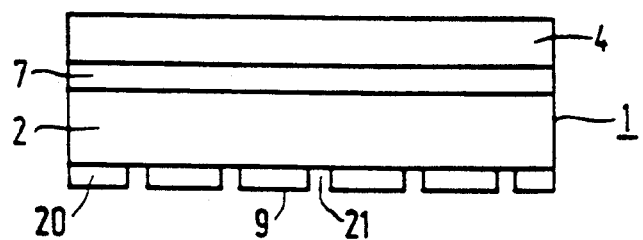
FIG. 3a is a side elevation and FIG. 3b is a bottom view of the carrier wafer provided with a wear-resistant layer with grooves.

When a wear-resistant layer 20 is provided on the carrier slice 2, such a layer usually has internal mechanical stresses, for example, approximately 6000 MPa in the case of titanium nitride. This causes the semiconductor body 1 to wrap. FIG. 3a and b shows that grooves 21 are preferably provided in the wear-resistant layer 20 for this reason, extending down to the carrier wafer 2. Such grooves 21 prevent large forces building up in the layer 20, so that the semiconductor body 1 will not become warped.

Preferably, the polishing discs 10 and 11 used in the polishing process are such that the polishing disc 11 facing the exposed main surface 9 of the carrier wafer 2 has a lesser polishing action than the polishing disc 10 facing the exposed main surface 8 of the semiconductor wafer 6. Polishing discs with different polishing actions are known and available. The polishing action may be strengthened or weakened, for example, by means of a greater or smaller yield of polishing agent from a polishing disc made of polishing chemotextile or a foamed synthetic resin which is porous to a greater or lesser extent. It is alternatively possible to provide the surface of the polishing disc 11 facing the exposed main surface 9 of the carrier wafer 2 with a layer 22 of a solid lubricant such as teflon.

EMBODIMENT 1

Figure 3B:
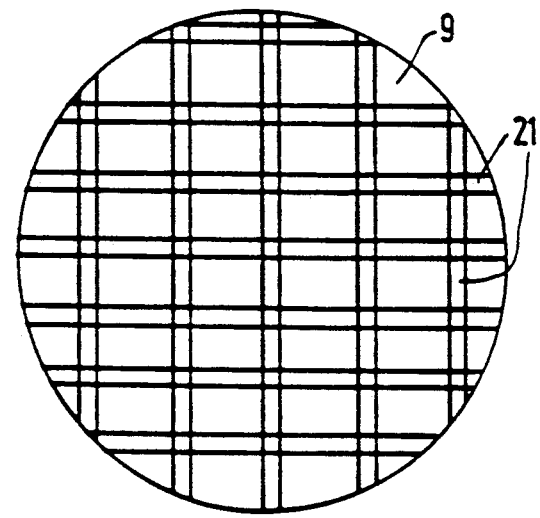

The starting item is a carrier wafer 2 of silicon with a thickness of 500 $\mu$m and a thickness variation of 0.2 $\mu$m. The carrier wafer 2 has two optically smooth main surfaces 3 and 9 with a roughness of below 1 nm. Near the main surface 3 of the carrier wafer 2 there is a layer of thermal oxide 7 of 0.1 $\mu$m thickness. The main surface 3 of the carrier wafer is now brought into contact with a main surface 5 having a roughness of below 1 nm of a second silicon wafer 6, so that a semiconductor body 1 is created. To reinforce this connection, the semiconductor body is treated at a temperature of 1200° C. for ten minutes. The exposed main surface 9 of the carrier wafer is then provided with a silicon nitride layer 20 by means of a "Low-Pressure Chemical Vapor Deposition" (LPCVD) process. To this end, the exposed main surface 8 of the semiconductor wafer 6 is covered and the semiconductor body 1 is placed in a reactor, after which a silicon nitride layer 20 with a thickness of 1 $\mu$m is deposited on the main surface 9 of the carrier wafer at atmospheric pressure by means of a reaction between silane and ammonia. Since the silicon nitride layer has an internal stress of approximately 1000 MPa, a network of parallel grooves 21 extending down to the carrier wafer 2, spaced 0.5 cm apart, and having a diameter of 0.1 mm is provided in the wear-resistant silicon nitride layer 20 (see FIG. 3a and 3b). The grooves may be made in usual manner by, for example, a plasma etching process. The semiconductor wafer is then reduced to a thickness of 50 $\mu$m by means of a back lapping process. Then the semiconductor wafer 6 is made even thinner in a polishing process in that the semiconductor body is arranged in a device according to FIG. 2a and b between two plane polishing discs 10 and 11 provided with a polishing liquid. Polishing discs of the make Rodel no. IC 40 are used, while Syton is used as the polishing liquid, i.e. SiO$_2$ particles with an average particle size of 30 nm in a KOH solution with a pH value between 10 and 11. The polishing pressure is 300 g/cm$^2$. The central shaft 16 and the outer ring 18 in this case rotate with speeds which differ by 25%. Polishing is continued down to a thickness of the semiconductor wafer of 10 μm. To reduce the semiconductor wafer in thickness with a greater precision, the pH value of the polishing liquid is then adapted towards a more neutral value, i.e. 8. The polishing process then proceeds more slowly, but with higher precision. The semiconductor wafer 6 is thus reduced to a thickness of 5 μm. The semiconductor body 1 may then be taken from the device. A semiconductor body 1 has then been manufactured having a top layer thickness of 5 μm and a variation of 0.1 μm on this thickness.

In practice, the variation in thickness of the top layer 4 achievable by the method according to the invention strongly depends on the carrier wafer 2 used. The more accurate the thickness of the carrier wafer 2, the more accurate the layer thickness which can be achieved. When a carrier wafer 2 with a thickness variation of approximately 20 nm is used, the method according to the invention is highly suitable as a cheaper and better alternative to SIMOX (Separation by IMplanted OXygen) semiconductor bodies. Oxygen is implanted into a semiconductor wafer in the manufacture of SIMOX semiconductor bodies, after which the wafer is subjected to a heat treatment. A semiconductor wafer having a thin (0.2 to 1 μm) semiconducting top layer on an oxide layer is then created. The quality of the semiconducting top layer and the oxide layer, however, is not ideal because the top layer is bombarded practically into the amorphous state during implantation, and the oxide layer does not have the dense structure of thermal oxide. With the method according to the invention, on the other hand, a perfect thin monocrystalline top layer can be manufactured on a thermal oxide layer.

In a manner analogous to that of the embodiment, a semiconductor body 1 with a top layer 4 of accurately determined thickness may be manufactured with a carrier wafer 2 having a different wear-resistant layer 20 which is provided in a usual manner. When the entire carrier wafer 2 consists of a wear-resistant material, the carrier wafer 2 may be manufactured to a correct dimension and the desired geometric precision by means of usual techniques. The carrier wafer 2 is then joined to a semiconductor wafer 6 by means of wafer bonding. The polishing process subsequently takes place in a manner analogous to that described above.

Grooves may be provided in the main surface 5 of the semiconductor wafer 6 in known manner before bonding, which grooves are filled, for example, with a nitride. During thickness reduction, the nitride in the semiconductor wafer 6 may serve as a polishing stopper, so that a top layer 4 having a well-defined layer thickness is manufactured.

The invention is not limited to the embodiment described above, but is applicable to analogous cases in which, for example, alternative polishing agents, polishing discs, or different polishing devices are used. Neither is the moment at which the wear-resistant layer is provided critical, as long as it lies before the polishing process.

We claim:

1. A method of manufacturing a semiconductor body whereby a carrier wafer having an optically smooth main surface is provided with a semiconducting top layer in that the main surface is brought into contact with an optically smooth main surface of a monocrystalline semiconductor wafer so that a permanent bond is formed, after which the semiconductor wafer is made thin by means of a grinding process followed by a polishing process, characterized in that the semiconductor wafer is made thin in the polishing process in that the exposed surface of the carrier wafer is rendered wear-resistant and in that then the carrier wafer bonded to the semiconductor wafer is arranged between two flat polishing discs provided with a polishing liquid, upon which these polishing discs and the exposed surfaces of the semiconductor wafer and the carrier wafer are moved relative to one another.

2. A method as claimed in claim 1, characterized in that the exposed surface of the carrier wafer is rendered wear-resistant in that a wear-resistant material is used as the material for the carrier wafer.

3. A method as claimed in claim 2, characterized in that a ceramic material is used as the material.

4. A method as claimed in claim 3, characterized in that a material selected from the group consisting of nitrides and carbides is used as the ceramic material.

5. A method as claimed in claim 1, characterized in that the exposed surface of the carrier wafer is rendered wear-resistant in that the exposed surface is provided with a wear-resistant layer.

6. A method as claimed in claim 5, characterized in that one of a nitride, carbide, and diamond layer is used as the wear-resistant layer.

7. A method as claimed in claim 5, in which both the carrier wafer and the semiconductor wafer comprise a silicon wafer, characterized in that aluminium nitride is used as the material for the wear-resistant layer.

8. A method as claimed in claim 5, characterized in that grooves extending down to the carrier wafer are provided in the wear-resistant layer.

9. A method as claimed in claim 1, characterized in that the polishing disc facing the exposed surface of the carrier wafer has a lesser polishing action than the polishing disc facing the exposed main surface of the semiconductor wafer.

* * * * *